US008404313B1

(12) United States Patent
Kumar et al.

(10) Patent No.: US 8,404,313 B1
(45) Date of Patent: Mar. 26, 2013

(54) SYNTHESIS OF NANOCRYSTALLINE DIAMOND FIBERS

(75) Inventors: Ashok Kumar, Tampa, FL (US); Manoj Kumar Singh, Tampa, FL (US)

(73) Assignee: University of South Florida, Tampa, FL (US)

( * ) Notice: Subject to any disclaimer, the term of this patent is extended or adjusted under 35 U.S.C. 154(b) by 935 days.

(21) Appl. No.: 11/689,575

(22) Filed: Mar. 22, 2007
(Under 37 CFR 1.47)

Related U.S. Application Data

(60) Provisional application No. 60/767,372, filed on Mar. 22, 2006.

(51) Int. Cl.
*C23C 16/00* (2006.01)
*B05D 3/06* (2006.01)

(52) U.S. Cl. .......................... 427/569; 427/575

(58) Field of Classification Search .................. None
See application file for complete search history.

(56) References Cited

U.S. PATENT DOCUMENTS

| | | | |
|---|---|---|---|
| 3,493,431 A | 2/1970 | Wagner | |
| 4,925,701 A * | 5/1990 | Jansen et al. | 427/575 |
| 5,271,971 A | 12/1993 | Herb et al. | |
| 5,277,975 A | 1/1994 | Herb et al. | |
| 5,580,380 A * | 12/1996 | Liu et al. | 117/85 |
| 6,774,036 B2 | 8/2004 | Goldstein | |
| 6,882,051 B2 | 4/2005 | Majumdar et al. | |
| 6,996,147 B2 | 2/2006 | Majumdar et al. | |
| 2002/0114756 A1 * | 8/2002 | Gruen et al. | 423/446 |
| 2003/0186522 A1 * | 10/2003 | Duan et al. | 438/584 |
| 2005/0016444 A1 | 1/2005 | Franz et al. | |
| 2006/0060864 A1 | 3/2006 | Gerbi | |
| 2006/0131588 A1 | 6/2006 | Gruen et al. | |
| 2006/0216515 A1 * | 9/2006 | Kazahaya et al. | 428/408 |

FOREIGN PATENT DOCUMENTS

| | | | |
|---|---|---|---|
| WO | WO2005/011902 | * | 2/2005 |
| WO | WO2006/043780 | * | 4/2006 |
| WO | WO 2006/085925 A2 | | 8/2006 |

OTHER PUBLICATIONS

Kim, K. H., Small, 2005, No. 8-9, p. 866-874.*
Grivargizov, E. I., J. Vac. Sci. Tech. B 11(2), Mar./Apr. 1993, p. 449-453.*
Xiao, Journal of Applied Physics, V96, No. 4, Aug. 2004, p. 2232.*
Xu, Zhenqing, Leonid Lev, Michael Lukitsch, and Ashok Kumar. Deposition of Adherent Diamond Coating on WC-Co Substrate. Department of Mechanical Engineering, University of South Florida, Tampa, FL 33620.
Duan, Xiangfeng and Charles M. Lieber. General Synthesis of Compound Semiconductor Nanowires. 2000. Adv. Mater. vol. 12, No. 4. pp. 298-302.

(Continued)

*Primary Examiner* — Joseph Miller, Jr.
(74) *Attorney, Agent, or Firm* — Nilay J. Choksi; Robert Varkonyi; Smith & Hopen, P.A.

(57) ABSTRACT

Provided herein is a method for the synthesis of nanocrystalline diamond (NCD) wires by depositing nanocrystalline diamond on Si nanowires using chemical vapor deposition methods. Seeding the nanowires in solutions containing nanodiamond powers, NCD wires are fabricated in typical CVD growth conditions within a very short time. NCD wires were 0.5-5 μm in diameter, depending on the growth time, with lengths in the range of 20-100 μm. The average elastic modulus determined by nanoindentation is 474.16±13.48 GPa. The unique mechanical properties of the NCD wire make it a potential material for active components of both electronic and electromechanical devices.

15 Claims, 9 Drawing Sheets

OTHER PUBLICATIONS

Xu, Zhenqing, Ashok Kumar, and Arun Kumar. Amperometric Detection of Glucose Using a Modified Nitrogen-Doped Nanocrystalline Diamond Electrode. 2005. J.Biomed. Nanotechnol. vol. 1, No. 4. pp. 1-5.

* cited by examiner

SYNTHESIS OF NANOCRYSTALLINE DIAMOND FIBERS

CROSS REFERENCE TO RELATED APPLICATIONS

This application is a Non-Provisional Application of co-pending U.S. Provisional Patent Application 60/767,372, filed Mar. 22, 2006; which is fully incorporated herein by reference.

STATEMENT OF GOVERNMENT INTEREST

This invention was made with Government support under Grant No. ECS-0404137 awarded by the National Science Foundation. The government has certain rights in this invention.

BACKGROUND OF THE INVENTION

This invention relates to the field of nano-technology. Specifically, the invention relates to the one-dimensional growth of nano-crystalline diamond fibers for use in the fabrication of high temperature and high power nano-electronic devices, i.e. biosensors for the electrochemical detection of neurotransmitters.

A nanowire is a wire of dimensions of the order of a nanometer ($10^{-9}$ meters). Alternatively, nanowires can be defined as structures that have a lateral size constrained to tens of nanometers or less and an unconstrained longitudinal size. Examples of different types of nanowires include metallic (Ni, Pt, Au), semiconducting and insulating; representative materials include, but are not limited to, InP, Si, GaN, $SiO_2$, $TiO_2$, etc.

Typical nanowires exhibit aspect ratios of 1000 or more. As such they are often referred to as 1-Dimensional materials. Nanowires have many interesting properties that are not seen in bulk or 3-D materials since electrons in nanowires are quantum confined laterally; and thus occupy energy levels that are different from the traditional continuum of energy levels or bands found in bulk materials. This quantum confinement is exhibited by certain nanowires, such as carbon nanotubes, which results in discrete values of electrical conductance. There are many applications where nanowires may become important in electronic, opto-electronic and nano-electromechanical devices, as additives in advanced composites, for metallic interconnects in nanoscale quantum devices, as field-emittors and as leads for biomolecular nanosensors.

Considerable interest has been focused on carbon nanotubes (CNTs) and carbon nanofibers (CNFs) due to their remarkable structural, electrical and mechanical properties. CNFs are grown from the decomposition of carbon-containing gases over metal or alloy surfaces, such as a nanowire, which act as catalysts to the sheets' formation. During the reaction, the carbon-containing gas molecules are adsorbed to certain faces of the catalyst's surface and are subsequently decomposed. Following this, the carbon atoms diffuse through the catalyst particle and precipitate and form successive sheets that stack on one another to form the carbon nanofibers.

Nanocrystalline diamond exhibits high hardness, exceptional thermal conductivity, chemical inertness, biocompatibility, and negative electron affinity. These unique properties make NCD a promising candidate for use as a protective coating with excellent tribological properties; a functional platform for biosensors; and structural material for micro-electro-mechanical systems (MEMS). Particularly, diamond electrodes have attracted considerable interest in recent years due to their superb electrical, thermal and electrochemical properties. However, until now most of the diamond related work is based on a two dimensional form of NCD; in other words, a thin film that is deposited on Si substrate. The question is if we can grow diamond wire just like other semiconductor wires such as Si and ZnO nanowires.

Diamond film has been deposited on metal wires such as Pt or W for electrochemical, biological, and thermal applications. However, the diameter of these diamond coated wires is in the order of hundreds of microns which significantly limits the sensitivity and selectivity of these electrodes.

SUMMARY OF INVENTION

Here, the inventors provide a method for the synthesis of one-dimensional nanocrystalline diamond fibers. These nanocrystalline diamond fibers were characterized by scanning electron microscopy (SEM), visible micro-Raman spectroscopy and high-resolution transmission electron microscopy (HR-TEM). The surface morphology of as prepared samples showed that the fibers were 0.3-2 μm in diameter and lengths in the order of 20-100 microns respectively. The Raman peaks at 1140 and 1333 $cm^{-1}$ were attributed to the nanocrystalline diamond nature of the fibers. The high-resolution transmission electron microscopy was performed in order to study the nanostructures of the diamond fibers.

The nanocrystalline diamond fibers have many applications such as in high-temperature and high power electronic devices. Further applications exist for biosensors for the electrochemical detection of neurotransmitters.

The inventors synthesized one-dimensional nanocrystalline diamond fibers by two-step method. In the first step the inventors prepared Si nanowires by using vapor-liquid-solid (VLS) mechanism and in next step these wires were used as templates for the growth of nanocrystallitie diamond fibers. Before the deposition, silicon oxide nanowires were seeded in a methanol solution which consists of 3-5 nm grain size diamond nanopowders. The nanocrystalline diamond was deposited by microwave decomposition in Ar, $H_2$ and $CR_4$ mixture for 20-60 minutes at 700° C. In some embodiments, the Argon was used at 75%. Nanocrystalline diamond fibers were characterized by scanning electron microscopy (SEM), visible micro-Raman spectroscopy and high-resolution transmission electron microscopy (I-IR-TEM), electron-energy loss spectroscopy (EELS) and near-edge X-ray absorption fine structures (NEXAFS).

BRIEF DESCRIPTION OF THE DRAWINGS

For a fuller understanding of the nature and objects of the invention, reference should be made to the following detailed description, taken in connection with the accompanying drawings, in which.

DETAILED DESCRIPTION OF THE PREFERRED EMBODIMENT

Figure 1A:
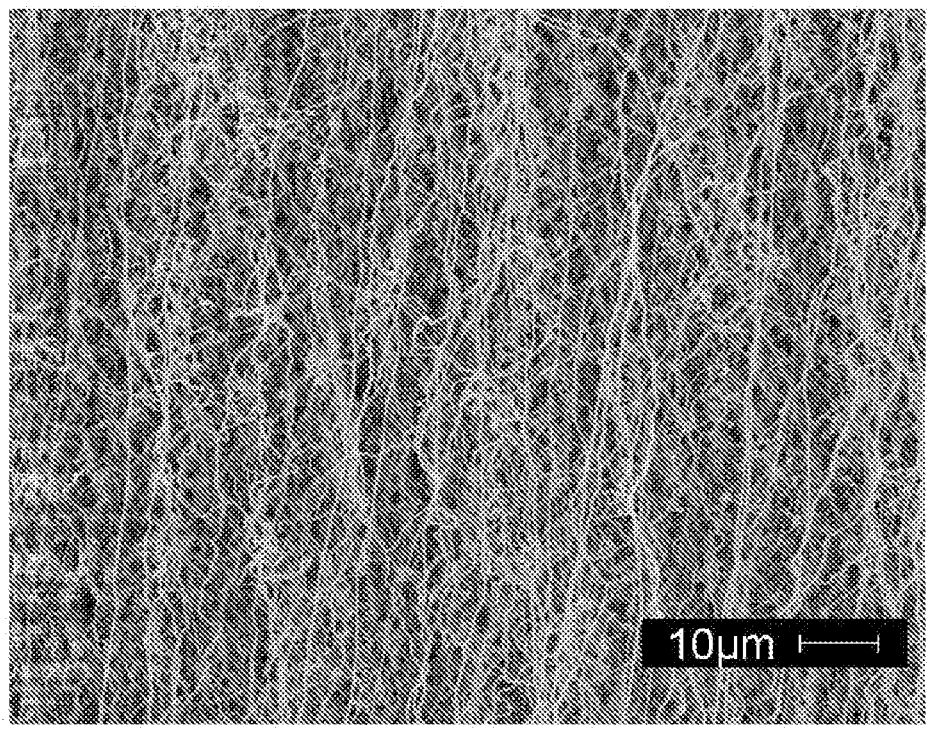
FIG. 1A is a SEM micrograph of Si nanowires.

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

Compared to other nanowires, the mechanical strength of NCD wires is several times higher than SiO2 nanowires or gold nanowires. Here, the inventors provide for the synthesis of nanocrystalline diamond wires with diameter in the order of several micrometers. Seeding the nanowires in solutions containing nanodiamond powers, NCD wires are fabricated in typical CVD growth conditions within a very short time.

In a preferred embodiment, one-dimensional nanocrystalline diamond fibers were created using nanowires prepared by a vapor-liquid-solid (VLS) mechanism and used as templates for the growth of nanocrystalline diamond fibers. These nanocrystalline diamond fibers have prospective applications such as field-emitters, high-temperature and high power electronic devices. Other applications include: biosensors such as the electrochemical detection of neurotransmitters, thermal heat spreaders, electron field emitters, electrode for bio-sensors, detection of neurons, tribological applications, implant coating applications, and high power electronics devices.

The formation of the diamond layer upon the substrate, here a nanowire, can be accomplished by any manner useful in the deposition of diamond. Examples include but are not limited to Chemical Vapor Deposition (CVD), Filament Assisted Chemical Vapor Deposition (FACVD), Plasma Enhanced Chemical Vapor Deposition, and Microwave Plasma Enhanced Chemical Vapor Deposition (MPECVD).

Substrates which can be used in the inventive method include carbide-forming materials which can be coated with diamond using conventional techniques, such as those described above. Although the preferred embodiment uses $SiO_2$ nanowires, substrates can be comprised of materials selected from the group consisting of silicon, glass, quartz, plastic, ceramic, metal, polymers, TiO, ZnO, ZnS, ZnSe, ZnTe, CdS, CdSe, CdTe, HgS, HgSe, HgTe, MgS, MgSe, MgTe, CaS, CaSe, CaTe, SrS, SrSe, SrTe, BaS, BaSe, BaTe, GaN, GaP, GaAs, GaSb, InN, InP, InAs, InSb, PbS, PbSe, PbTe, AlS, AlP, AlSb, SiO.sub.1, SiO.sub.2, silicon carbide, silicon nitride, polyacrylonitrile (PAN), polyetherketone, polyimide, an aromatic polymer, and an aliphatic polymer. Substrates are preferably substantially homogenous in material but can include hetereostructures in some embodiments.

The term "nanowire" refers to a nanostructure typically characterized by at least one physical dimension less than about 1000 nm, 500 nm, 250 nm, 150 nm, 100 nm, 50 nm, 25 nm, 10 nm or 5 nm. In a preferred embodiment, the region or characteristic dimension is along the smallest axis of the structure. Illustrative nanostructures include nanofilaments, nanofibers and nanotubes.

Nanowires can be synthesized by a variety of methods. In a preferred embodiment, the nanowires are synthesized using a Vapor-Liquid-Solid (VLS) mechanism (which is known). Examples of the VLS mechanism can be found in U.S. Pat. No. 6,996,147 to Majumdar et al. and in *General Synthesis of Compound Semiconductor Nanowires,* Xiangfeng Duan and Charles M. Lieber, Adv. Matter. 2000, Vol. 12, No. 4; which are incorporated herein by reference.

It should be noted that the invention is not limited to nanowires produced using the VLS mechanism. The VLS mechanism, however, provides advantages in the production of one-dimensional nanostructures including the ability to control the diameter and monodispersity of the nanowire through the use of catalyst (substrate) particles of well-defined sizes; the ability to grow the nanowires on a solid support and in a patterned array by manipulating the catalyst particles; the ability to generate nanowires with well-controlled length and well-defined variation in the longitudinal composition; and, the ability to process semi-conductors using a solid phase protocol.

One-dimensional nanocrystalline diamond fibers were synthesized by a two-step method. In the first step the inventors prepared silicone oxide ($SiO_2$) nanowires by using vapor-liquid-solid (VLS) mechanism and in next step these wires were used as templates for the growth of nanocrystalline diamond fibers. Before deposition, $SiO_2$ nanowires were immersed in a methanol solution which consisted of 3-5 nm grain-size diamond nanopowders. The nanocrystalline diamond was deposited by microwave decomposition of an Ar, $H_2$ and $CH_4$ mixture for 20-60 minutes at 700° C.

The resulting nanocrystalline diamond fibers were characterized by scanning electron microscopy (SEM), visible micro-Raman spectroscopy and high-resolution transmission electron microscopy (I-IR-TEM), electron- energy loss spectroscopy (EELS) and near-edge X-ray absorption fine structures (NEXAFS). The surface morphology of nanofibers prepared using the inventive method showed that the fibers were 0.3-2 µm in diameter and lengths in the order of 20-100 microns respectively. The Raman peaks at 1140 and 1333 $cm^{-1}$ were attributed to the nanocrystalline diamond nature of the fibers. The high-resolution transmission electron microscopy was performed in order to study the nanostructures of the diamond fibers.

The invention includes a method of synthesizing NCD wires by depositing NCD coatings on conductive nanowires, such as Si, in typical microwave plasma enhanced chemical vapor deposition (MPECVD) growth conditions. The diameter of the wire is approximately in the range of 1-5 µm and the length of the wire is more than 30 µm. By reducing the diameter from a couple hundred micrometers to a few micrometers, a higher surface to volume ratio is obtained for better biological or electrochemical functionalization. Moreover, the diameter of the wire is proportional to the growth time, providing a controlled method to fabricate nanocrystalline diamond wires.

Figure 1B:
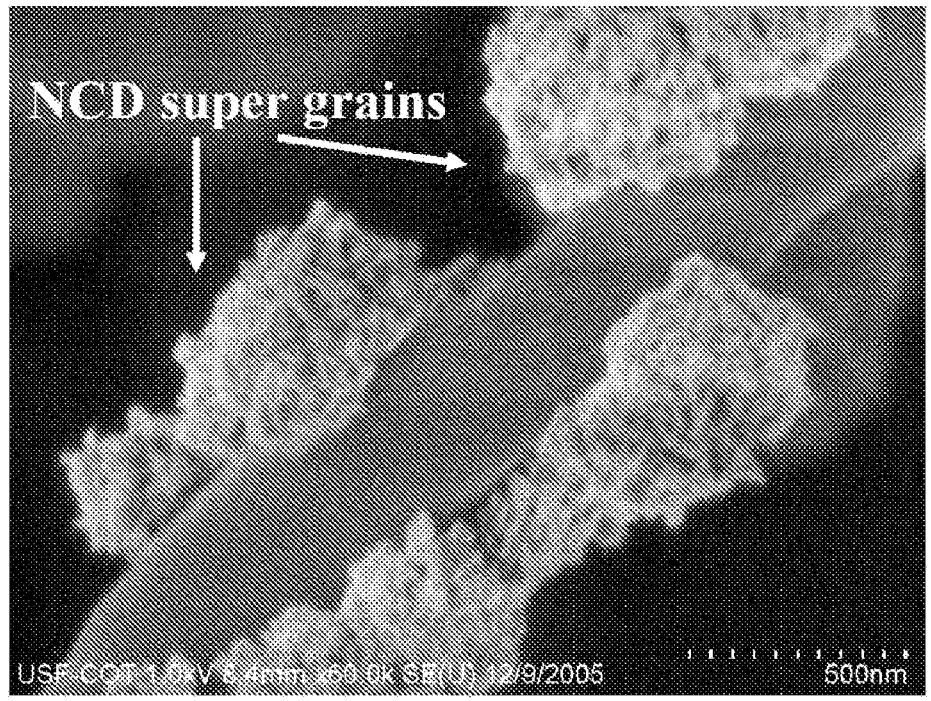
FIG. 1B is a SEM image of diamond deposition for 10 min, showing some NCD super grains have been deposited.

In FIG. 1A, the SEM micrograph shows that the lengths of these nanowires are in the range of several tens to several hundreds of micrometers and the diameters of these wires are approximately several hundreds of nanometers. In an illustrative embodiment, the nanowires were composed of silicon nanoparticles as cores and amorphous silicon oxide as shells. The nanowires are randomly oriented and stick to each other in some cases. FIG. 1B shows that after 10 min of diamond deposition, nanowires are partially coated with a few nanocrystalline diamond supergrains. These supergrains, consisting of many nanometer-sized crystalline diamond grains, have also been observed in the deposition of hybrid structure of ultrananocrystalline diamond (UNCD) and carbon nanotubes (CNTs).

Surprisingly, diamond grew much faster on nanowires than it did on flat Si substrate. The nanodiamond seeds left on nanowires are believed to be responsible for such fast growth. It should be addressed that without seeding in the nanodiamond containing solution, no growth was observed. Hence, these small nanodiamond seeds play an important role in the growth of NCD wires. The nanowires were totally covered with NCD films after 15 minutes of deposition. The diameters of these wires ranged between 1 and 2 μm.

Figure 1C:
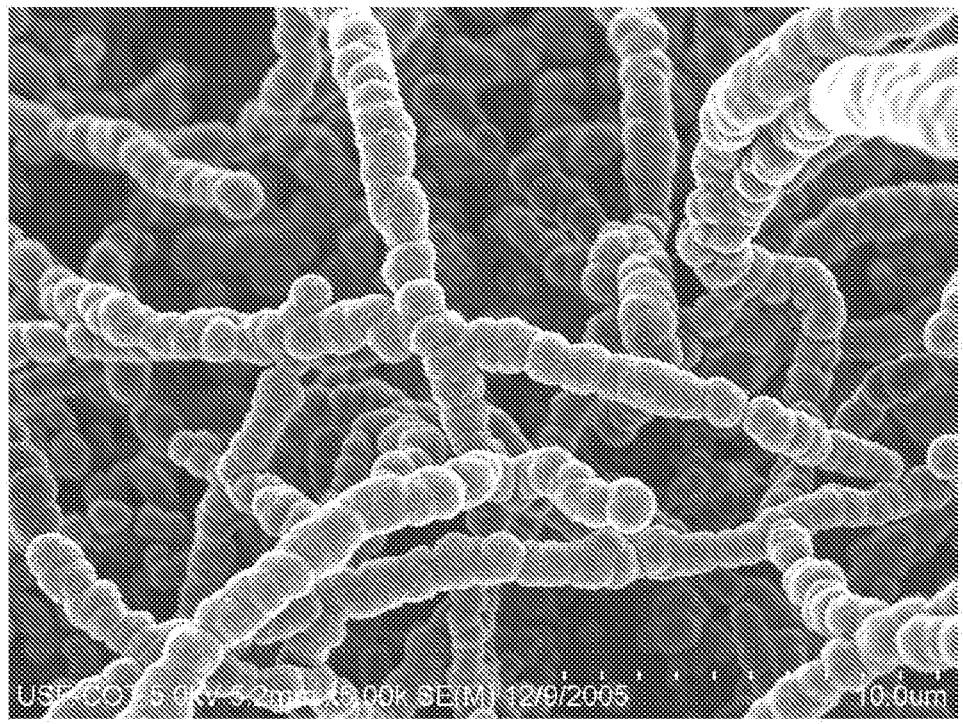
FIG. 1C is a SEM image after 15 min deposition; all SiNWs were coated with NCD.

It was observed that the diameters of the wires increased to approximately 4-5 μm after 30 minutes of deposition. A continuous NCD coating was formed and covered all the nanowires as well as the substrate (Si) after 1 hour of deposition. Note that in FIG. 1C, the NCD coating covered not only along the nanowires, but also on the tips of the wires.

Figure 1D:
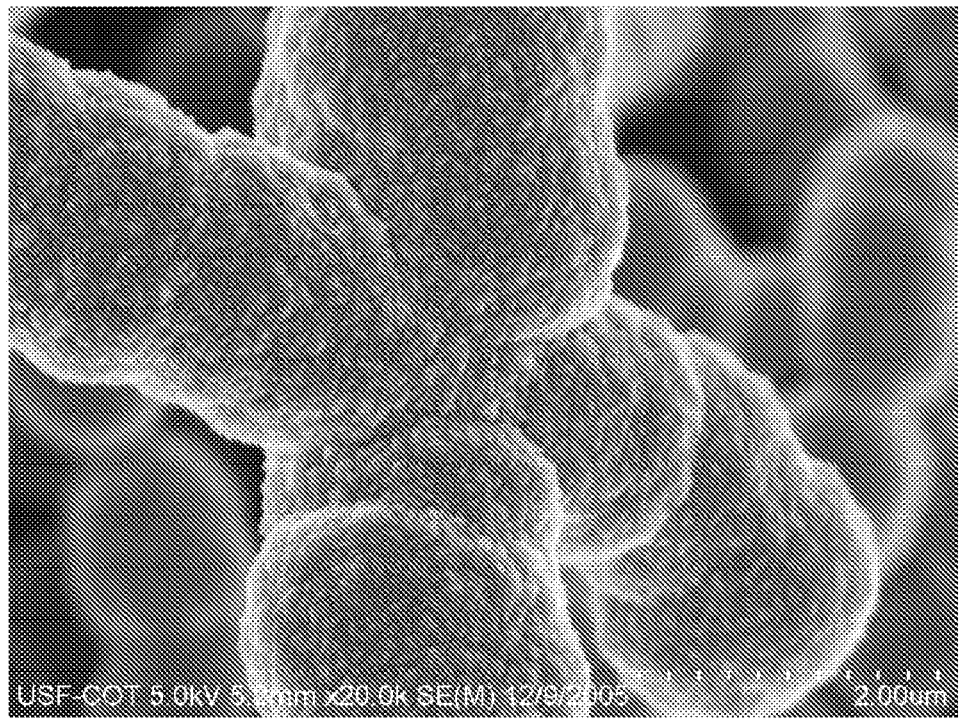
FIG. 1D is a SEM image showing two NCD wires grown together.

Two nanowires connected to each other (as shown in FIG. 1D), illustrates the possibility of fabricating complicated NCD wire structures by patterning nanowires. Since diamond can be doped with boron or nitrogen to make it electrically conductive, such structures have interesting applications for MEMS fabrication. Moreover, with the outstanding mechanical properties of bulk diamond, these NCD wires have potential applications in areas that need materials with high strength and stiffness.

Figure 2A:
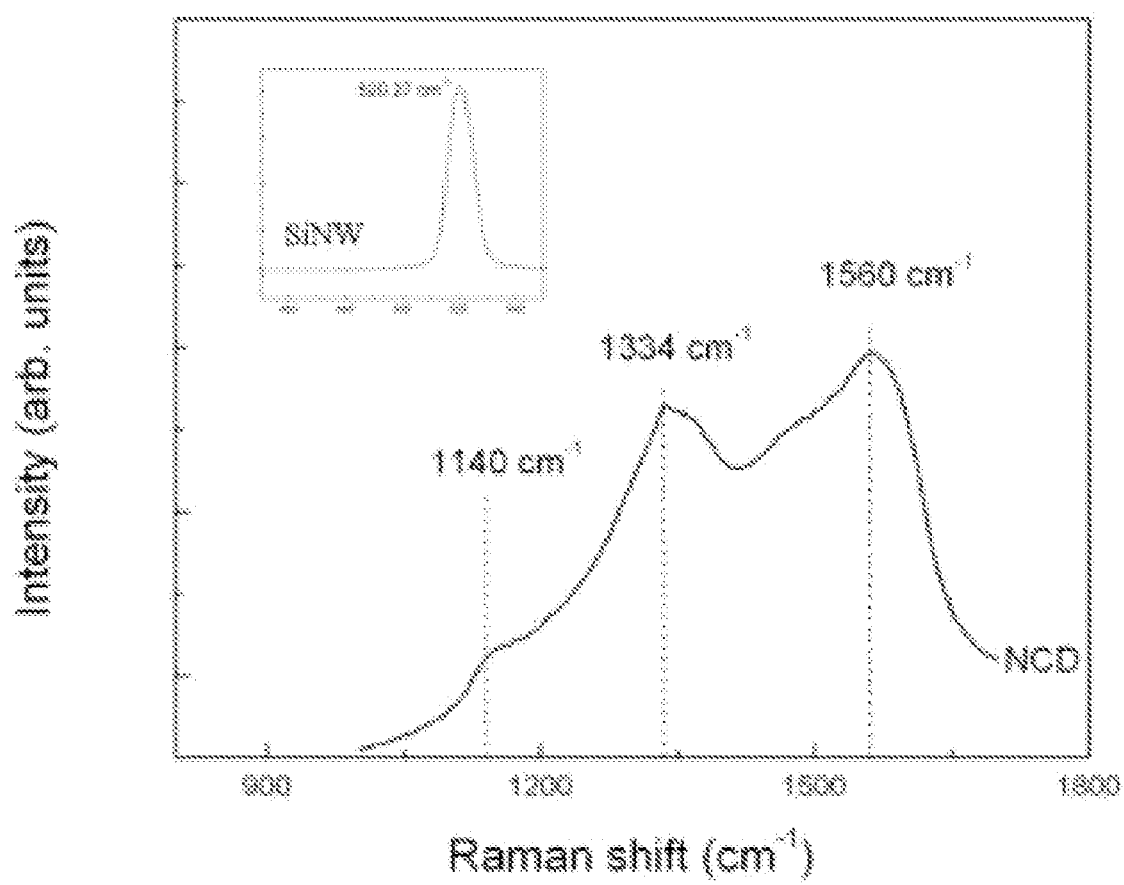
FIG. 2A is a graph of Raman spectra of Si Nanowire and NCD wires. The inset picture shows the Si peak of SiNW with FWHM value about 10 wave numbers.

FIG. 2A shows the micro-Raman scattering spectra of nanowires and NCD wires. The nanowires spectrum, shown in the inset picture, reveals a prominent Raman feature at ~520 cm-1. Note that there is no obvious Raman frequency down-shift caused by size confinement effect which was observed frequently for nanowires. Since the average diameter of these nanowires is larger than 100 nm and the wires are randomly oriented, it is understandable that no significant frequency change was observed. In addition, the characteristic peak at 520 cm-1 becomes broadened in width compared to first-order optical phonon mode of single-crystal silicon. The full width at half maximum (FWHM) of the spectrum is about 10 wave numbers, which is similar to other published values.

Raman analysis was also performed after the nanowires were seeded in nanodiamond solution. Identical spectrum was obtained and no features other than Si peak were observed. After 15 min deposition, the Raman spectrum shows typical NCD patterns with a diamond characteristic peak at 1334 cm-1 overlapping with a D-band peak at 1340 cm-1, a small hump at 1140 cm-1 and a broad peak centered at 1560 cm-1. The 1140 hump is recently proposed to be attributed to great amount of hydrogen presented in NCD grain boundaries. The broad peak at 1560 cm-1 is the G-mode Raman peak, which is well known for disordered carbon films and arises from the in-plane stretching modes of sp2 bonded carbon at grain boundaries of NCD.

Figure 2B:
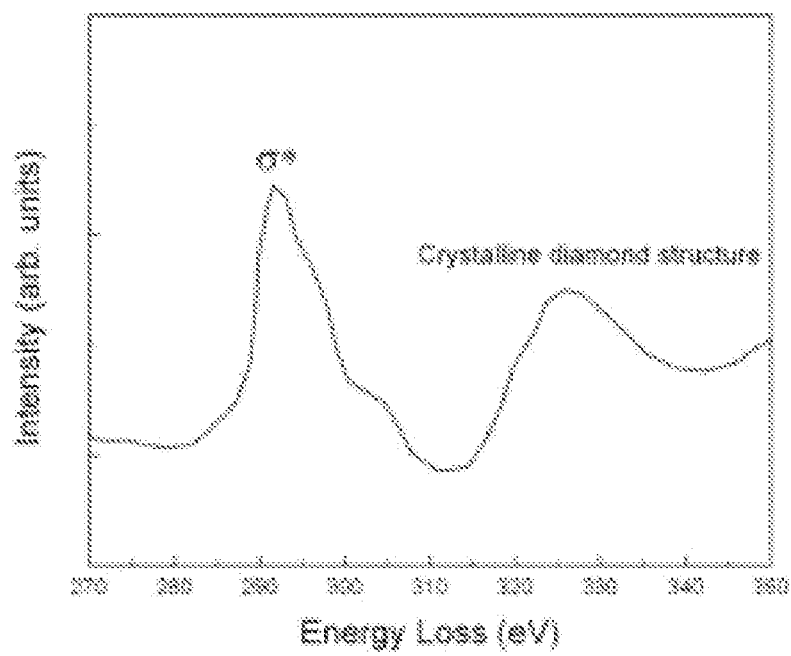
FIG. 2B is a graph showing EELS.
Figure 2C:
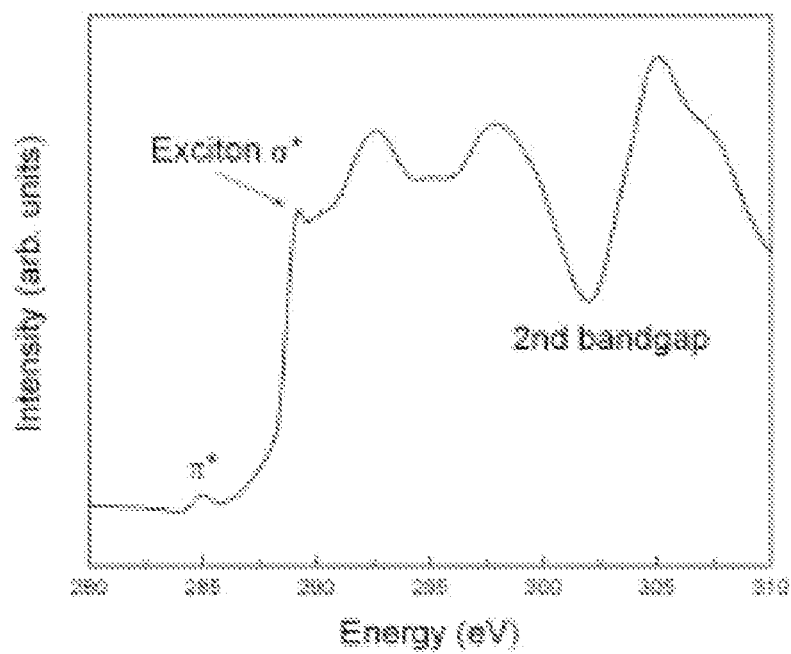
FIG. 2C is a graph of NEXAFS analysis of NCD wires. Both spectra show the wire is composed of sp3 bonded carbon.

FIG. 2B shows the electron energy loss spectroscopy (EELS) analysis of the NCD wires. The EELS is sensitive to the crystal structure. For trigonal sp2-bonded carbon, the spectrum can be separated into two broad features, corresponding to the π* states between 282 and 288 eV and the σ* states between 290 and 320 eV, while for tetrahedral sp3-bonded carbon only the σ* peak is observed between 289 and 320 eV 18. For NCD wires, only one peak at 291 eV was observed, representing typical diamond structure. NEXAFS spectroscopy is also a useful tool to unambiguously distinguish the sp2 bonds from the sp3 bonds in carbon materials. FIG. 2C shows the C (1s) photoabsorption data obtained from NCD wires. The spectrum looks very similar to high quality single-crystal diamond. It is well known that amorphous carbon shows the characteristic transition to sp2 bonded π* orbitals at ~285 eV and bulk diamond shows a sharp peak at ~289.5 eV due to the bulk C-1s core exciton and characteristic transitions to sp3 bonded σ* orbitals. These two features are directly related to the bonding structures of diamond and graphite, and could be used to determine the sp2 to sp3 ratio in a film. In FIG. 2C it can clearly be seen that all the qualitative features of sp3 bonding are presented in the sample. A distinct second band gap dip at 302.5 eV is also observed, which is not presented in sp2 bonded carbon. A very small peak at 285 eV reveals that these wires are phase pure diamond with very a small amount of sp2 bonded carbon in the film. The fraction of sp2 bonded carbon to sp3 bonded carbon in NCD is around 5~10%.

Figure 3A:
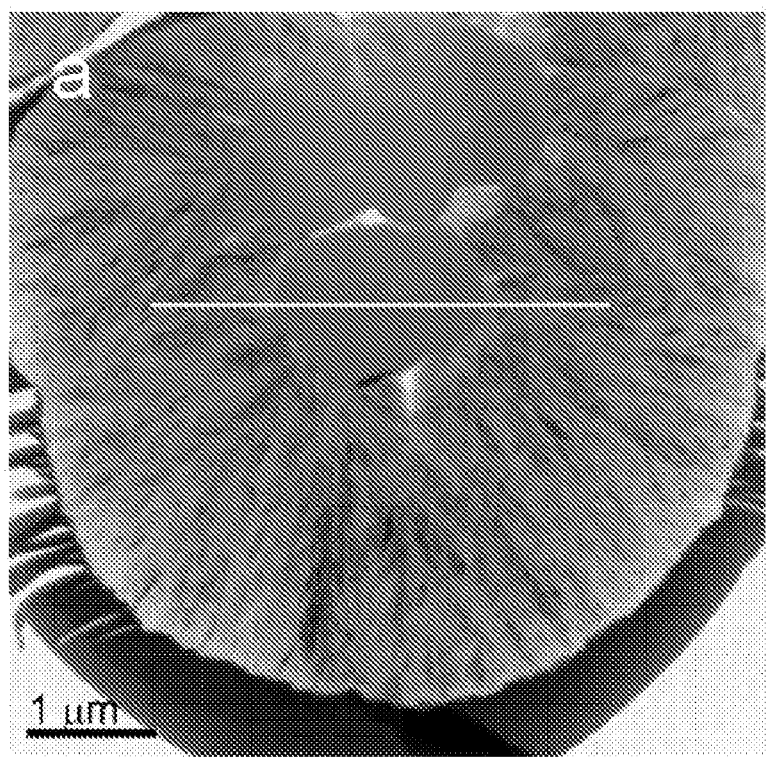
FIG. 3A is TEM cross section image of the as deposited NCD wire.
Figure 3B:
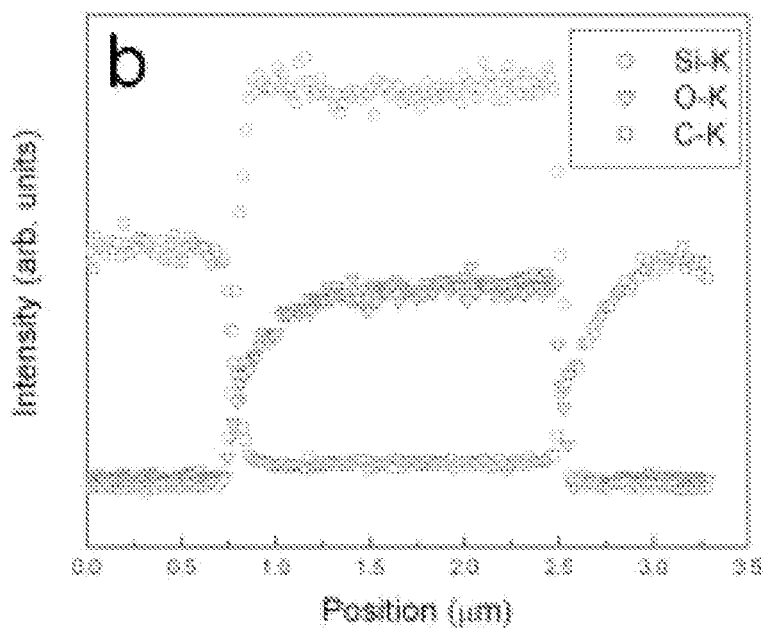
FIG. 3B is a one line profile Si—O—C mapping along the line indicated in FIG. 3A.
Figure 3C:
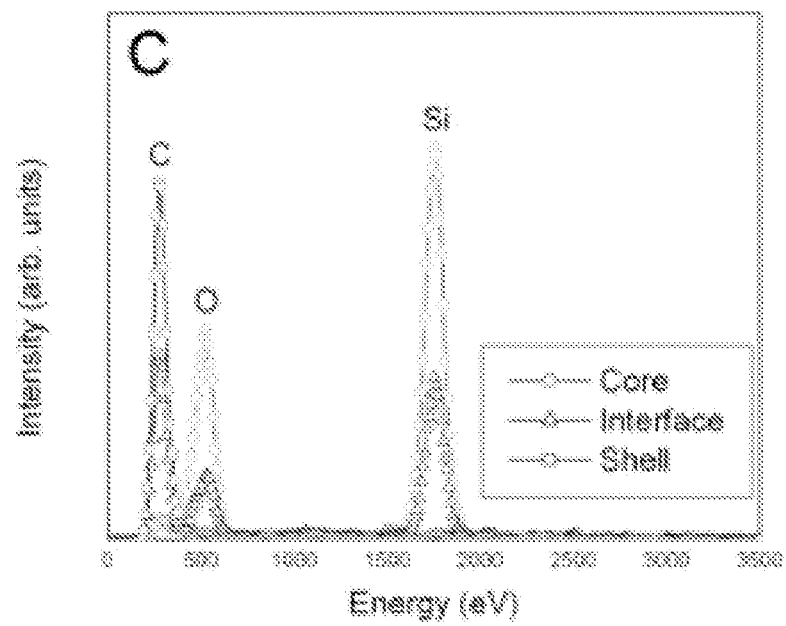
FIG. 3C shows EDS analysis performed at three positions: SiNW core, interface and diamond shell.
Figure 3D:
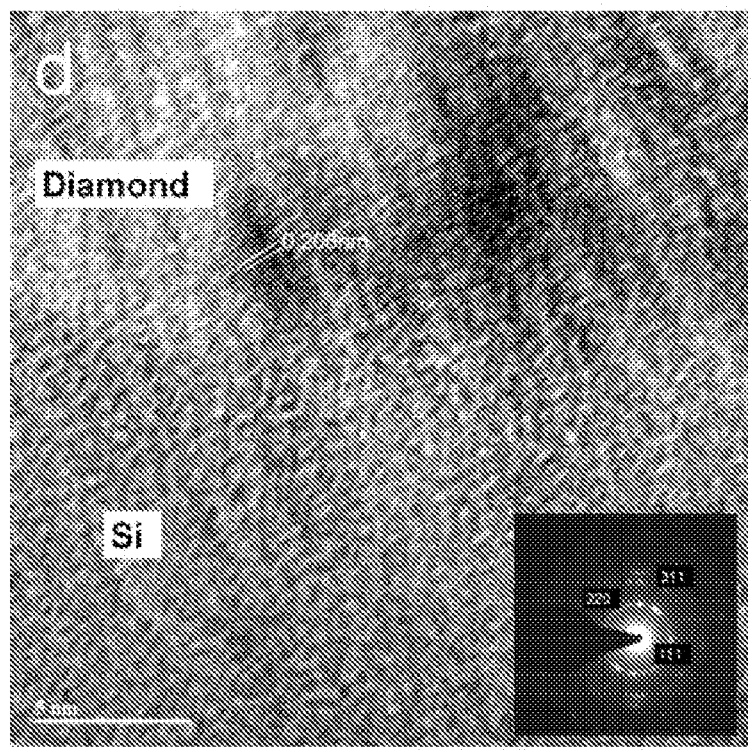
FIG. 3D is a HREM image of diamond-SiNW interface; d spacing of (111) diamond plane is 0.206 nm. Inset: SAED pattern of diamond shell shows good crystallinity.

In order to investigate the structure of these NCD wires, one small piece of wire was cut from the substrate by focus ion beam (FIB) and then was transferred to copper grid for TEM analysis. FIG. 3A shows a cross section TEM image of one single diamond wire. The diameter of this wire is about 4 μm (30 min deposition). The NCD wire contains two regions, the core and the shell. Note that in the core region there are three nanowires encapsulated in one diamond shell. As mentioned before, some nanowires might stick together after the growth and they were never separated afterwards. During CVD process, diamond supergrains grew outside of these wires and then quickly connected to each other and finally covered all these bundled wires together. The quantification analysis in the SiNW core region indicates the atomic percentage of Si is 40% and the atomic percentage of O is 60%, suggesting that the nanowires are composed of amorphous silicon oxide. EDS study has been done on three different locations of the wire: core, interface and shell, shown in FIG. 3B. In the core region, silicon and O peaks were observed at 1.74 and 0.52 keV, respectively. In the shell region, a dominant C peak at 0.28 keV suggested that the outside shell only consist of carbon. At the interface, all three peaks, C, O, and Si are visible. In the core region, only Si and O peaks are presented. FIG. 3C shows the 1 line profile Si—O—C map along the cross section of the wire. Similar to EDS results, the NCD wire core contains Si and O while the outside shell contains only carbon. The high resolution electron microscopy (HREM) image shows the interface between the diamond and the Si nanowire (FIG. 3D). The diamond grains seen here are about 5-8 nm in diameter and the d-spacing for the (111) planes in diamond is 0.206 nm Note that the no clear crystallinity of Si can be observed, suggesting the amorphous nature of the nanowires. In the selected area electron diffraction (SAED) pattern taken at the diamond shell region (FIG. 3D inset), sharp (111), (220), and (311) Bragg reflections are visible, indicating good crystallinity of NCD.

Figure 4A:
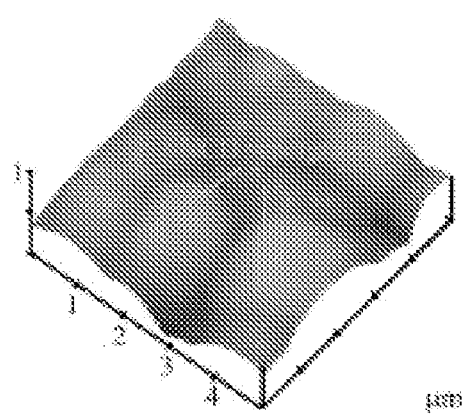
FIG. 4A shows the morphology of NCD supergrains scanned with a conical indenter.
Figure 4B:
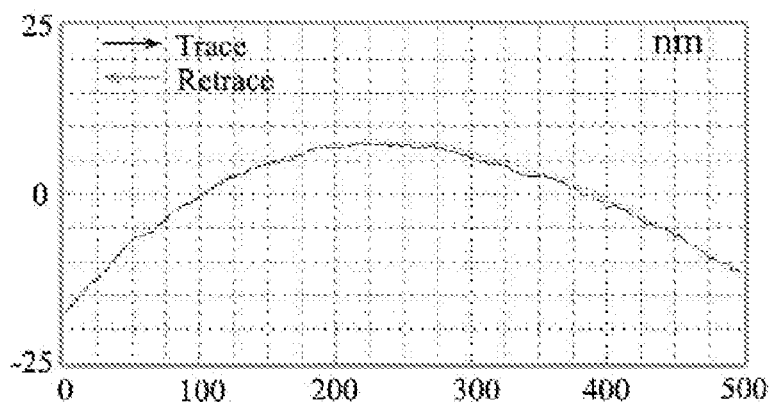
FIG. 4B shows a typical surface profile of the indented NCD supergrain.
Figure 4C:
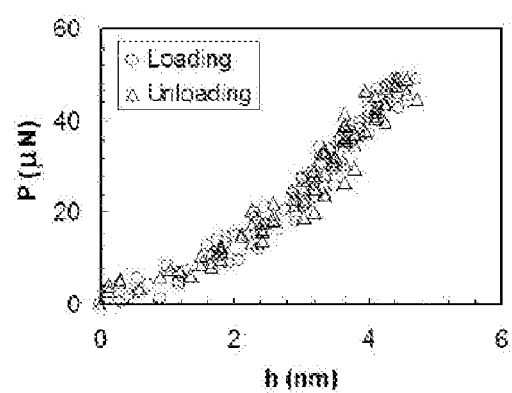
FIG. 4C shows a typical indentation load and displacement, P-h, curve.

Nanoindentation tests were carried out using a Triboscope (Hysitron, Inc. Minneapolis, Minn., USA) in conjunction with an atomic force microscope (AFM) (NanoScope Dimension™ 3100, Digital Instruments, Veeco Metrology Group, Woodbury, N.Y., USA). The indenter used for indentation is a conical diamond indenter with an included angle of 60°. During indentation, the indenter was first brought into contact with the NCD supergrains shown in FIG. 4A. Using the offset functions in AFM, the indenter was shift to the top of a NCD supergrain. By gradually shrinking the scanning area and offsetting the scanning center of the indenter, the indentation tip was brought to the center of the NCD supergrain. When the scan size was reduced to 500 nm×500 nm, a scope scan was done at the middle of the NCD supergrain, which gives the surface profile of the NCD supergrain (FIG. 4B). The curvature of each individual tested NCD supergrain can be obtained from the surface profile by curve fitting. Further reducing the scan size down to 100 nm×100 nm, indentation was carried out at the center of the NCD supergrain. A peak force of 50 µN was first applied in 5 seconds and then totally released in the same time. A typical indentation load and displacement curve is shown in FIG. 4C. As can be seen, indentation is a pure elastic one with no hysteresis between the loading and the unloading curve.

For an elastic contact between solids of revolution, the relationship between the contact force and displacement can be given by Hertz contact theory, $$P = \frac{4}{3} E^* R^{1/2} h^{3/2}$$

where P is the contact (indentation) force, E* is the reduced modulus, R is the relative curvature of contact, and h is the contact displacement. The reduced modulus is given by $$\frac{1}{E^*} = \frac{1-v_s^2}{E_s} + \frac{1-v_i^2}{E_i} \quad (2)$$

where Es, Ei are the elastic moduli and $v_s$, $v^i$ are the Poisson's ratios of sample and indenter, respectively. The relative curvature of contact is given by $$\frac{1}{R} = \frac{1}{R_s} + \frac{1}{R_i} \quad (3)$$

where Rs, Ri are the curvature of sample and indenter, respectively.

Figure 4D:
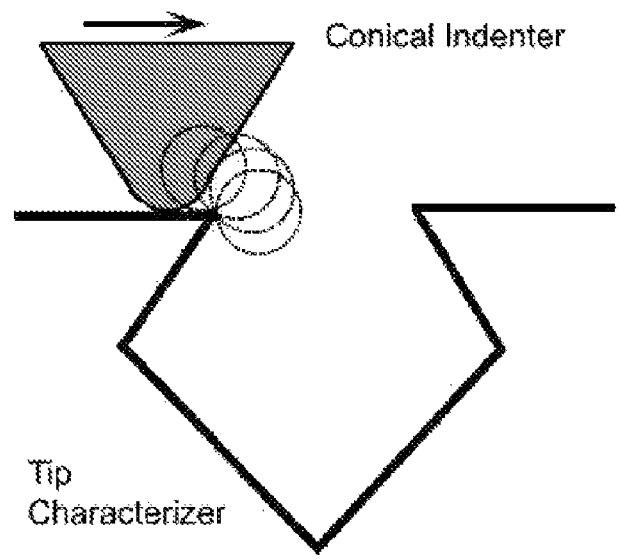
FIG. 4D is a schematic of a mechanism of the tip radius calibration.
Figure 4E:
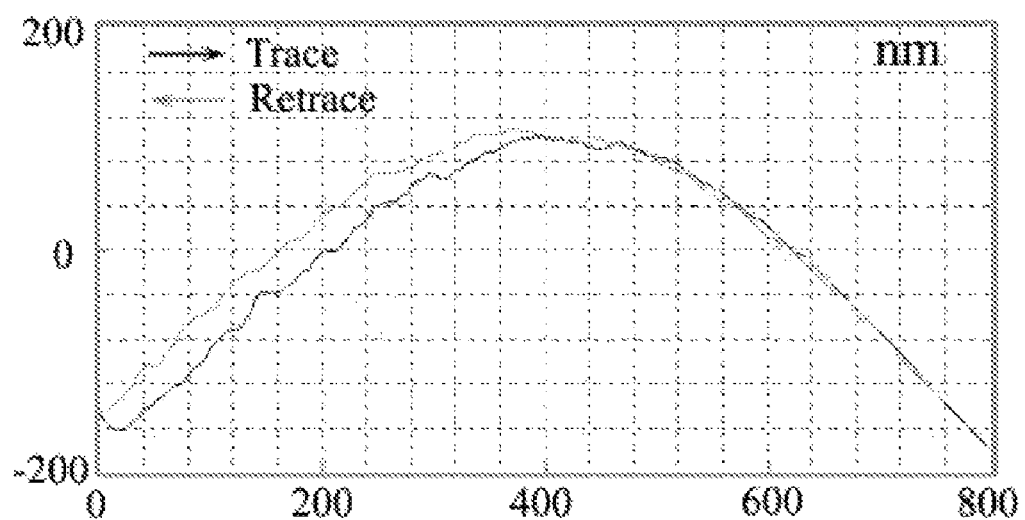
FIG. 4E shows typical scope scan lines showing curvature of the conical indenter tips.

In order to estimate the elastic modulus using Hertz contact theory (Eq. (1)), the radius of the indenter tip must be known. To calibrate the tip radius of the conical indenter, the conical tip used in the nanoindentation test was used to scan a special SOCS Tip Characterizer (Veeco Metrology Group, Woodbury, N.Y., USA). A schematic of the mechanism of the tip radius calibration is shown in FIG. 4D. As can be seen, the SOCS Tip Characterizer has a trench with very sharp edges. When the blunt conical tip scans across the sharp edge, it cannot capture the real feature of the much sharper edge while instead the scope profile of the scanning gives the curvature of the conical tip (see FIG. 4E). By curve fitting of the scope profiles of both 0 and 90 degree scannings of the conical tip against the sharp edge, the average tip radius of the conical tip used in this study is determined to be 157.88±23.13 nm.

Figure 4F:
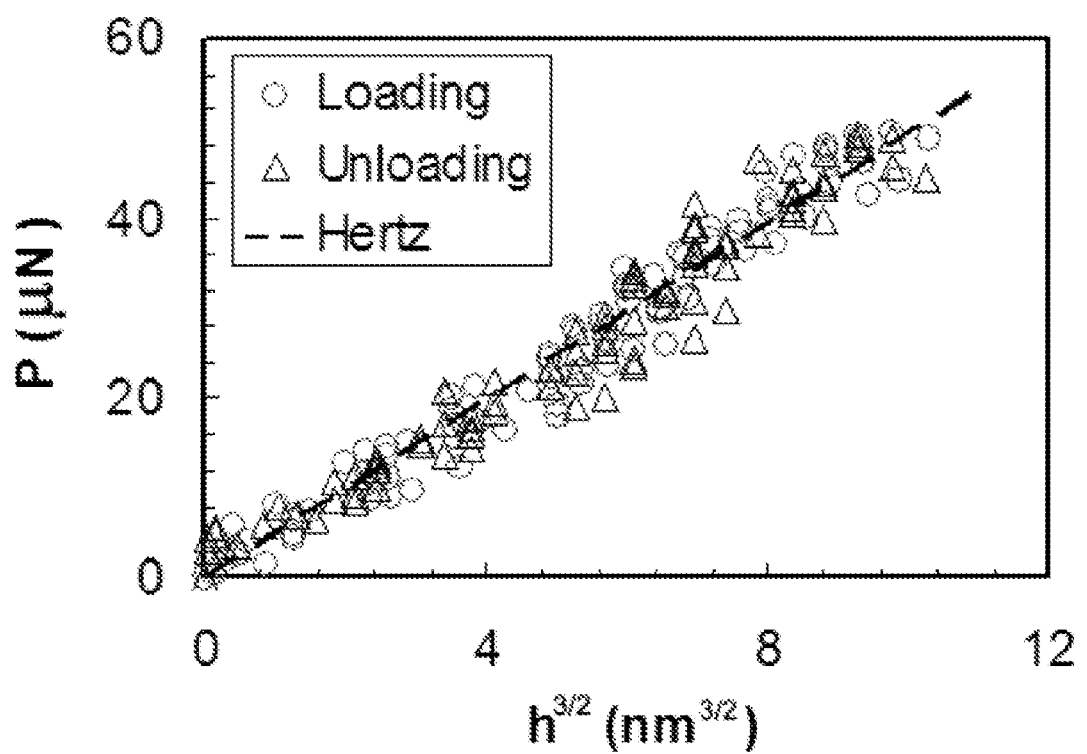
FIG. 4F shows curve fitting of nanoindentation curve by Hertz contact theory.

An excellent fitting of Hertz contact theory with the P-h3/2 plot of the real indentation curve is shown in FIG. 4f. Using the slope of the linear P-h3/2 plot, the tip radius of the conical indenter, the curvature of the NCD nanograins, and a Poisson's ratio of 0.07 for diamond, the elastic modulus of NCD supergrain can be obtained using Eqs. (1)-(3). An average elastic modulus determined from nine indentations on three individual NCD supergrains is 474.16±13.48 GPa. This value is higher than the elastic modulus of CVD NCD film 387±17 GPa measured by nanoindentation with a Berkovich indenter using Oliver and Pharr method while lower than the values measured by other methods, e.g. 626±17 GPa by two-biaxial bending test and 695±4 GPa by free vibration of NCD plates and 517~1120 GPa by surface acoustic wave test of NCD film.

Raman, EELS, NEXAFS, and TEM analysis revealed that NCD were deposited on nanowires to form NCD wires. The elastic modulus of the NCD wires measured by nanoindentation is 474.16±13.48 GPa. This new type of diamond structure will find numerous applications by taking advantage of NCD's extreme properties. Moreover, NCD wire may enable the production of molecular sieves, high surface area electrodes and other applications where diamond films are not applicable. Remarkable electron and high current density has been achieved using thin film NCD 27, 28 while nitrogen doped NCD wires may further improve the field emission properties with their unique geometry.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall there between. Now that the invention has been described,

What is claimed is:

1. A method of synthesizing a crystalline diamond fiber or diamond crystalline nanowire comprising the steps of:
    seeding a nanowire template in a nanodiamond solution, wherein the nanowire template is a non-diamond nanowire, such that the nanodiamond is seeded on the circumference of the nanowire template;
    placing the nanowire template in a chemical vapor deposition chamber;
    establishing a plasma in the chemical vapor deposition chamber consisting of a predetermined concentration of hydrogen, argon, and a hydrocarbon; and
    depositing diamond particles on the nanowire template by chemical vapor deposition, wherein the diamond particles form a crystalline diamond fiber or diamond crystalline nanowire,
    wherein the nanowire template includes a bundle of non-diamond nanowires so that a diamond shell encapsulates the bundle of non-diamond nanowires to form the crystalline diamond fiber or diamond crystalline nanowire, said bundle of non-diamond nanowires formed from a material selected from the group consisting of silicon, glass quartz, plastic, ceramic, metal, polymers, TiO, ZnO, ZnS, ZnSe, ZnTe, CdS, CdSe, CdTe, HgS, HgSe, HgTe, MgS, MgSe, MgTe, CaS, CaSe, CaTe, SrS, SrSe, SrTe, BaS, BaSe, BaTe, GaN, GaP, GaAs, GaSb, InN, InP, InAs, InSb, PbS, PbSe, PbTe, AlS, AlP, AlSb, $SiO_1$, $SiO_2$, silicon carbide, silicon nitride, polyacrylonitrile (PAN), polyetherketone, polyimide, an aromatic polymer, and an aliphatic polymer.

2. The method of claim 1 wherein the nanowire template is prepared using a vapor-liquid-solid process.

3. The method of claim 1 wherein a surface of the nanowire template is scratched prior to the deposition step.

4. The method of claim 1 wherein the nanodiamond solution is diamond nanopowder having a grain size of about 3-5 nm in methanol.

5. The method of claim 1 wherein the nanocrystalline diamond particles are deposited on the nanowire template by microwave plasma-enhanced chemical vapor deposition (MPECVD).

6. The method of claim 1 further comprising doping the diamond with a material selected from the group consisting of boron and nitrogen.

7. The method of claim 1 wherein the nanowire template is brought to 700° C. during the chemical vapor deposition.

8. The method of claim 1 further comprising coupling the crystalline diamond fiber or diamond crystalline nanowire to a second crystalline diamond fiber or diamond crystalline nanowire, the second crystalline diamond fiber or diamond crystalline nanowire formed using the foregoing steps.

9. A method of forming a nano-crystalline diamond fiber comprising the steps of:

seeding a nanowire template in a nanodiamond solution, wherein the nanowire template is a non-diamond nanowire, such that the nanodiamond is seeded on the circumference of the nanowire template;

placing the nanowire template in a chemical vapor deposition chamber;

establishing a plasma in the chemical vapor deposition chamber consisting of a predetermined concentration of hydrogen, argon, and a hydrocarbon; and depositing nano-crystalline diamond particles on the nanowire template by chemical vapor deposition, wherein the nano-crystalline diamond particles form a crystalline diamond fiber, wherein the nanowire template includes a bundle of non-diamond nanowires so that a diamond shell encapsulates the bundle of non-diamond nanowires to form the crystalline diamond fiber or diamond crystalline nanowire, said bundle of non-diamond nanowires formed from a material selected from the group consisting of silicon, glass quartz, plastic, ceramic, metal, polymers, TiO, ZnO, ZnS, ZnSe, ZnTe, CdS, CdSe, CdTe, HgS, HgSe, HgTe, MgS, MgSe, MgTe, CaS, CaSe, CaTe, SrS, SrSe, SrTe, BaS, BaSe, BaTe, GaN, GaP, GaAs, GaSb, InN, InP, InAs, InSb, PbS, PbSe, PbTe, AlS, AlP, AlSb, $SiO_1$, $SiO_2$, silicon carbide, silicon nitride, polyacrylonitrile (PAN), polyetherketone, polyimide, an aromatic polymer, and an aliphatic polymer.

10. The method of claim 9 wherein the nanowire is prepared template using a vapor-liquid-solid process.

11. The method of claim 9 the surface of the nanowire template is scratched prior to the deposition step.

12. The method of claim 9 wherein the diamond particles are nanocrystalline diamond particles and wherein the nanocrystalline diamond particles are deposited on the nanowire template by microwave deposition.

13. The method of claim 9 wherein the diamond particles are nanocrystalline diamond particles and wherein the nanocrystalline diamond particles are deposited on the nanowire template by microwave plasma-enhanced chemical vapor deposition (MPECVD).

14. The method of claim 9 further comprising doping the diamond with a material selected from the group consisting of boron and nitrogen.

15. The method of claim 9 wherein the nanowire template is brought to 700° C. during the chemical vapor deposition.

* * * * *